United States Patent
Worden et al.

(10) Patent No.: US 11,303,074 B2
(45) Date of Patent: Apr. 12, 2022

(54) ENCLOSURES TO CONSTRAIN THE LOCATION OF CONNECTORS IN AUTOMATION APPLICATIONS

(71) Applicant: Google LLC, Mountain View, CA (US)

(72) Inventors: Nathanael Arling Worden, Mill Creek, WA (US); Samuel Gardner Garrett, Seattle, WA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/907,785

(22) Filed: Jun. 22, 2020

(65) Prior Publication Data

US 2021/0399504 A1 Dec. 23, 2021

(51) Int. Cl.
*H01R 13/64* (2006.01)
*H01R 13/73* (2006.01)
*H01R 13/514* (2006.01)
*B25J 15/00* (2006.01)
*H01R 43/26* (2006.01)
*B25J 5/00* (2006.01)

(52) U.S. Cl.
CPC .......... *H01R 13/73* (2013.01); *B25J 15/0095* (2013.01); *H01R 13/514* (2013.01); *H01R 43/26* (2013.01); *B25J 5/00* (2013.01)

(58) Field of Classification Search
CPC ...... H01R 13/514; H01R 13/73; H01R 43/26; B25J 15/0095; B25J 5/00
USPC ......................................................... 439/374
See application file for complete search history.

(56) References Cited

U.S. PATENT DOCUMENTS

| | | | | |
|---|---|---|---|---|
| 4,831,270 A | * | 5/1989 | Weisenberger | H01J 37/147 250/398 |
| 4,882,881 A | * | 11/1989 | VanKuiken, Jr | B23Q 1/621 451/89 |
| 5,654,870 A | * | 8/1997 | Havener | H01M 50/213 361/600 |
| 5,655,869 A | * | 8/1997 | Scheler | H01L 21/67775 414/222.01 |
| 5,694,290 A | * | 12/1997 | Chang | G11B 33/025 361/679.31 |
| 5,775,946 A | | 7/1998 | Briones | |
| 5,986,889 A | * | 11/1999 | Chang | H05K 7/1421 361/679.41 |

(Continued)

FOREIGN PATENT DOCUMENTS

| | | |
|---|---|---|
| CN | 101714727 A | 5/2010 |
| CN | 203481527 U | 3/2014 |

(Continued)

OTHER PUBLICATIONS

Extended European Search Report for European Patent Application No. 20208987.6 dated May 14, 2021. 10 pages.

(Continued)

*Primary Examiner* — Abdullah A Riyami
*Assistant Examiner* — Vladimir Imas
(74) *Attorney, Agent, or Firm* — Lerner, David, Littenberg, Krumholz & Mentlik, LLP

(57) ABSTRACT

An enclosure comprising a housing having a first end and a second end opposite the first end, the housing having a first connector receptacle at the first end, the housing having a surface defining a robot-engaging mechanism, a hook extending from the second end of the housing, and a securement mechanism at the second end of the housing.

20 Claims, 4 Drawing Sheets

(56) References Cited

U.S. PATENT DOCUMENTS

| | | | | |
|---|---|---|---|---|
| 6,167,612 | B1* | 1/2001 | Cunliffe | H01R 43/26 29/747 |
| 8,992,263 | B2* | 3/2015 | Fallon | H01R 13/748 439/660 |
| 9,413,107 | B2* | 8/2016 | Fallon | H01R 43/26 |
| 9,456,524 | B2* | 9/2016 | Ohfuchi | H05K 5/0247 |
| 9,961,793 | B1 | 5/2018 | Wong et al. | |
| 10,187,706 | B2* | 1/2019 | Smith | H05K 7/1491 |
| 10,732,026 | B1* | 8/2020 | Danenberg | G01G 21/00 |
| 10,746,589 | B1* | 8/2020 | Danenberg | G01G 19/42 |
| 10,814,480 | B2* | 10/2020 | Georgeson | B25J 9/1015 |
| 2002/0072276 | A1 | 6/2002 | Lewis | |
| 2002/0076990 | A1* | 6/2002 | Fujita | H01R 13/514 439/701 |
| 2003/0002261 | A1* | 1/2003 | Berry | H05K 7/1489 361/727 |
| 2007/0120513 | A1* | 5/2007 | Tanaka | B25J 9/1602 318/568.11 |
| 2009/0086441 | A1* | 4/2009 | Randall | H05K 7/1492 361/724 |
| 2010/0000758 | A1* | 1/2010 | Bravo | H02G 3/16 174/60 |
| 2010/0156253 | A1* | 6/2010 | Ohfuchi | H05K 7/1467 312/201 |
| 2011/0114801 | A1 | 5/2011 | Ehmann | |
| 2014/0126158 | A1* | 5/2014 | Baran | H01R 9/2458 361/729 |
| 2016/0297075 | A1* | 10/2016 | Lee | H01R 43/26 |
| 2019/0020134 | A1 | 1/2019 | Suzuki et al. | |
| 2020/0052476 | A1* | 2/2020 | Maier | G02B 6/4451 |
| 2020/0078078 | A1* | 3/2020 | Henderson | A61B 34/25 |
| 2020/0078081 | A1* | 3/2020 | Jayme | A61B 17/072 |
| 2020/0078082 | A1* | 3/2020 | Henderson | A61B 90/98 |
| 2020/0078089 | A1* | 3/2020 | Henderson | A61B 34/20 |
| 2020/0078106 | A1* | 3/2020 | Henderson | A61B 50/22 |
| 2020/0124812 | A1 | 4/2020 | Dannoux et al. | |
| 2020/0133368 | A1 | 4/2020 | Volek et al. | |
| 2020/0136316 | A1 | 4/2020 | Cho et al. | |
| 2020/0146160 | A1 | 5/2020 | Coffey et al. | |

FOREIGN PATENT DOCUMENTS

| | | |
|---|---|---|
| CN | 105470722 A | 4/2016 |
| CN | 107745171 A | 3/2018 |
| CN | 109075505 A | 12/2018 |
| CN | 209461717 U | 10/2019 |
| CN | 209730321 U | 12/2019 |
| CN | 209896308 U | 1/2020 |
| CN | 209948106 U | 1/2020 |
| DE | 102017217601 A1 | 4/2019 |
| JP | 2019160762 A | 9/2019 |
| WO | 2014047547 A1 | 3/2014 |

OTHER PUBLICATIONS

First Office Action for Chinese Patent Application No. 202011061464.5 dated May 28, 2021. 7 pages.

* cited by examiner

ENCLOSURES TO CONSTRAIN THE LOCATION OF CONNECTORS IN AUTOMATION APPLICATIONS

BACKGROUND

The automation of certain tasks in data center management allows for a savings in cost and increase in efficiency due to a decreased reliance on human labor and accompanying human error. One task that has consistently required humans is cable/connector management. For instance, unplugging a connector such that an end of the connector is unconstrained and re-grasping the end connector to plug in elsewhere is a simple task for a human to perform. However, performing such connector management with a robot is insurmountable in many cases as it would be exceedingly difficult for the robot to accurately find the unconstrained end of the connector and re-grasp it. The inability of robots to perform connector management in data centers is an obstacle in further automating data center management for operations like disconnecting and replacing data center components, such as servers, batteries, or the like.

BRIEF SUMMARY

In accordance with an aspect of the disclosure, an enclosure comprising a housing having a first end and a second end opposite the first end, the housing having a first connector receptacle at the first end, the housing having a surface defining a robot-engaging mechanism, a hook extending from the second end of the housing, and a securement mechanism at the second end of the housing. The enclosure may further comprise a cover plate opposite the surface of the housing and secured to the housing through a plurality of screws. The housing may include a second connector receptacle at the first end, the connector receptacle including a first cage for receiving a first connector and the second connector receptacle including a second cage for receiving a second connector. The robot-engaging feature may be a plurality of elongated triangular indents along a bottom surface of the housing. The housing may define a width, the hook extending the width of the housing. The securement feature may be one of a magnet, suction cup, screw, or adhesive surface. The securement feature may be a magnet within the housing.

In accordance with another aspect of the disclosure, an enclosure comprising a housing defining a length, the housing having a first end, a first surface, and a second surface opposite the first surface, the housing defining a connector receptacle adjacent the first end, a hook extending from the first surface of the housing adjacent the first end, a securement mechanism secured along the length of the housing, and a robot-engaging mechanism extending from the second surface of the housing and adjacent the first end. The housing may define a longitudinal axis and the robot-engaging mechanism is an extension that extends in a direction along, and offset from, the longitudinal axis. The housing may define a chamfered portion from the first end to the connector receptacle. The housing may define a longitudinal axis and the receptacle is transverse to the longitudinal axis. The securement mechanism may be one of a magnet, suction cup, screw, or adhesive surface. The securement mechanism may be a magnet secured within the receptacle of the housing. The hook may include a magnet secured within the hook. The hook may include a body and a lip extending from the body curved about an axis, the magnet being secured within an opening transverse to the axis. The first surface may define a cavity along the length of the housing, an end of the cavity abutting the hook.

In accordance with another aspect of the disclosure, a method of using a robot to manage connectors, comprising engaging, by the robot, a robot-engaging mechanism of the enclosure, the enclosure comprising a hook extending from the housing and a securement mechanism secured within the housing, inserting, by the robot, an end of a connector in a connector receptacle defined by the housing of the enclosure, engaging, by the robot, the end of the connector, and disengaging, by the robot, the end of the connector from the connector receptacle. The robot-engaging mechanism may be a plurality of elongated triangular indents, and engaging the triangular indents includes inserting a portion of the robot into the triangular indents. The robot-engaging mechanism may be an extension extending from the housing, and engaging the extension includes grasping the extension. The securement mechanism may be a magnet within a receptacle of the housing. The method may further comprise moving, by the robot, the enclosure from a first location to a second location.

BRIEF DESCRIPTION OF THE DRAWINGS

FIGS. 5-9 illustrates an example scenario of a robot interfacing with an enclosure.

FIG. 10 depicts an example flowchart of the method of using an enclosure in accordance with aspects of the disclosure.

DETAILED DESCRIPTION

Figure 1:
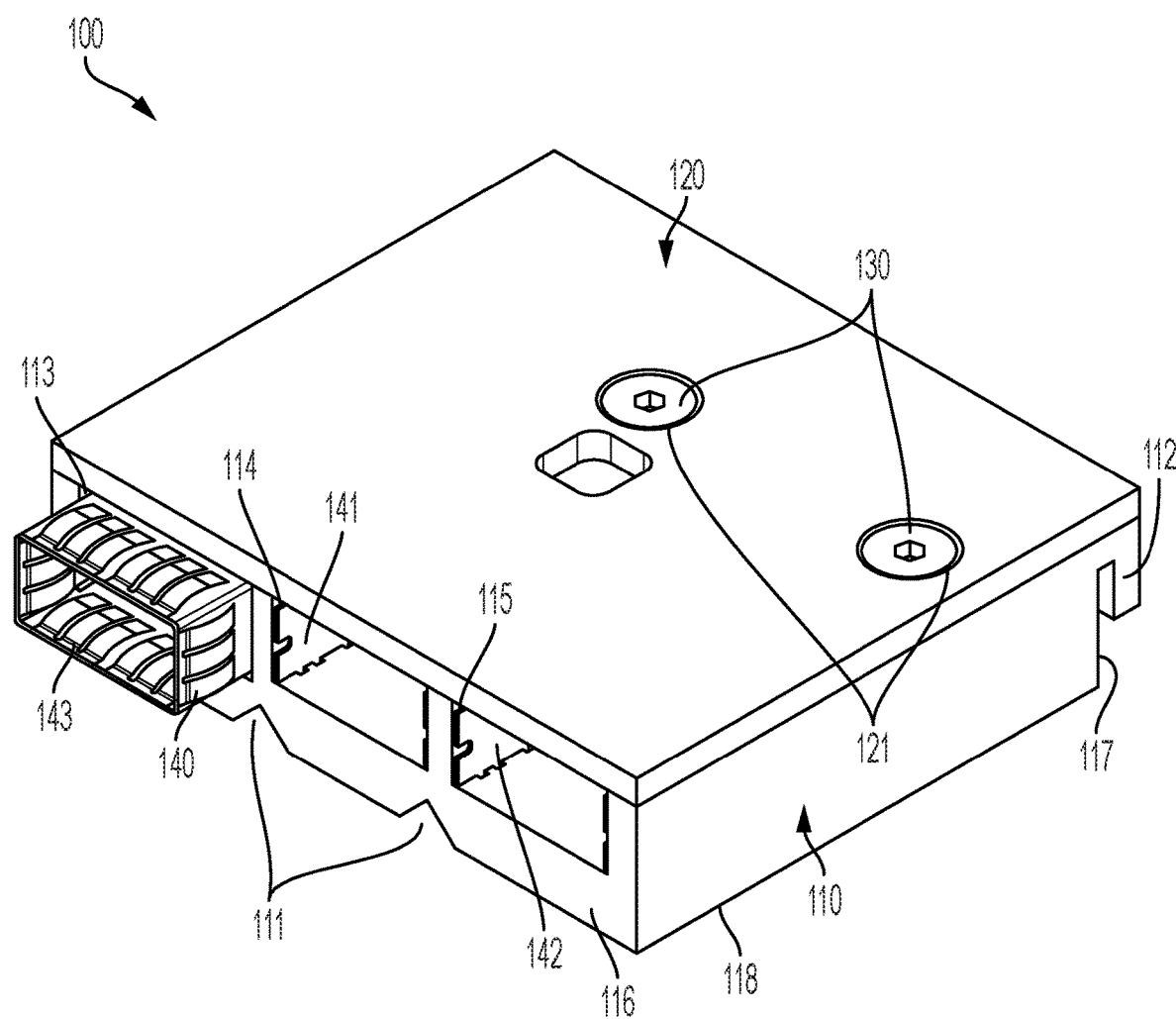
FIG. 1 is an isometric view of an enclosure in accordance with aspects of the disclosure.

This technology is directed to an enclosure for housing ends of a connector, wherein the enclosure is configured to interface with a robot. The enclosure can be secured to a location, such as within a datacenter, through both a hook and a securement mechanism to allow for a robot to consistently locate the enclosure. The securement mechanism can allow for the enclosure to remain in a fixed position at the location prior to being engaged by the robot but to allow for the robot to move the enclosure when the robot engages the enclosure. Such a securement mechanism can include a magnet, suction cup, adhesive surface, screw, or any other means of securing the enclosure to the location. Moreover, the enclosure can include a robot-engaging mechanism that allows the robot to consistently interface in a certain orientation, such as a plurality of indents along a surface of the enclosure, to allow for a portion of a robot, such as an end-effector, to be inserted within or an extension extending from the enclosure to be grasped by the end-effector of the robot. The secured position of the enclosure from the hook and securement mechanism, as well as the ability for the robot to interface with the robot-engaging mechanism, can allow for the automation of connector management and enables a more complete automation of, for example, data centers or the like.

FIGS. 1A-B depicts enclosure 100 having cover plate 120 secured to housing 110. Housing 110 has a first end 116 and second end 117 with a bottom surface 118. Housing 110 includes a robot-engaging mechanism in the form of a plurality of elongated triangular indents 111, and a hook 112 extending from second end 117. Housing 110 includes receptacles 113, 114, 115 having connector cages 140, 141, 142 respectively received within each of the receptacles. Housing 110 includes columns 131 extending from surface 118 within the housing. Columns 131 can be configured to receive a shaft portion of screws 130. Screws 130 secure cover plate 120 to housing 110.

Indents 111 extend from a first end 116 of housing 110 toward second end 117 along a bottom surface 118 of housing 110 and a partial length of housing 110. Indents 111 allow for a portion of the robot, such as an end-effector, to be inserted within the indents. A proper alignment between the end-effector and the indents 111 may further ensure a proper alignment between an end of a connector (not shown) and one or more of connector receptacles 113, 114, 115. As such, the robot may have precise and repeatable engagement with enclosure 100.

The indents may have any number of alternative shapes or sizes depending on the corresponding portion of the robot. For instance, indents 111 may extend along the entire length of the bottom surface 118 of housing 110. In another example, indents 111 may be any shape configured to interface with a robot, such as a rectangular shape, hexagonal shape, or any other geometric shape. Further, there may be any number of indents 111, such as one, three, four, or any other number. In other examples, indents 111 may additionally or alternatively be placed along any portion of housing 110 as well as on cover plate 120. Moreover, indents 111 may have any spacing or orientation with respect to each other. For instance, indents 111 can be manufactured adjacent each end of housing 110. In another example, indents 111 can run transverse to each other or at any angle with respect to housing 110.

Connector receptacles 113, 114, 115 are defined along a portion of the length of housing 110 and extends from first end 116 to second end 117. Connector receptacles 113, 114, 115 are shaped and sized to receive connector cages 140, 141, 142. Each of connector cages 140, 141, 142 are designed to receive a connector having a certain type of connector end. In one example, connecter cage 140 can be configured to receive a connector having a small form-factor connector pluggable end, such as a quad small-form factor pluggable (QSFP). Connector cage 140 can have a lead-in portion 143 protruding away from housing 110. The lead-in portion 143 may minimize the precision required to insert a QFSP end within the connector cage. In this manner, lead-in portion 143 allows for a more repeatable connector insertion. Further, connector cages 141, 142 can be configured to receive a connector having an iPass™ end. In this instance, since connector cage 140 is larger than connector cages 141, 142, connector receptacle 113 is correspondingly larger than connector receptacles 114, 115.

In other examples, there may be any number of connector receptacles 113, 114, 115, such as one, two, or any other number. In a yet further example, connector receptacles 113, 114, 115 may be shaped and sized to receive connector cages 140, 141, 142 corresponding to any combination of ends of connectors, such as QSFP, iPass™, Universal Serial Bus (USB), RJ45, or any other type of end for a connector. Further, connector receptacles 113, 114, 115 do not have to be oriented in a row along a width of housing 110. For example, the connector receptacles can be oriented vertically from bottom surface 118 to cover plate 120, or the like. In a yet further example, there may be no connector cages 140, 141, 142. For example, connector receptacles 113, 114, 115 can be manufactured having a shape configured to receive the specific type of end of a connector without the connector cages.

A position of enclosure 100 is secured to an adjacent structure (not shown), such as a server rack in a data center through a securement mechanism, magnet 150. Magnet 150 is substantially cylindrical and secured within a receptacle defined within housing 110 at a central portion of a wall of the housing at second end 117. However, in other examples, the magnet may be placed along any portion of enclosure 100, such as within a receptacle extending from a side wall of housing 110 or from a receptacle extending from cover plate 120. Magnet 150 is configured to secure the position of enclosure by providing an attracting magnetic force between enclosure 100 and a corresponding magnetic portion of the adjacent structure. This attracting magnet force can minimize the risk of moving or re-orienting enclosure 100. In other examples, there may be any number of magnets 150, such as two, three, four, or any other number. In a further example, magnet 150 is not cylindrical and can have any shape, such as cuboid, spherical, or any other geometric prism shape. In a yet further example, securement mechanism is a suction cup, adhesive surface, screw, or any other means of securing the position of enclosure 100 to the adjacent structure.

Hook 112 extends away from second end 117 and has a width similar to the width of housing 110. In other examples, hook 112 may not extend the width of housing 110 but only a portion of the width of the housing. In such an instance, there may additionally be any number of hooks, such as two, three, four, or any other number. Hook 112 can be configured to mate with a corresponding protruding portion of the adjacent structure, such as a shelf of a server rack having integral springs that allow for a friction fit between the server rack and the enclosure. The engagement between hook 112 and the adjacent structure can assist in securing a position of enclosure 100 to the adjacent structure. A recess 119 is defined along a central portion of hook 112. This can ensure that there is minimal interference between magnet 150 and the magnetic portion of the adjacent structure, while still allowing hook 112 to provide support to the position of enclosure 100. As the consistency of the position of enclosure 100 is paramount to a robot being able to accurately find the enclosure, both magnet 150 and hook 112 serve important roles in maintaining the position of the enclosure.

Cover plate 120 is sized and shaped to the length and width of housing 110. As such, cover plate 120 can overlay housing 110 and protect the internal components of the housing. Cover plate 120 is secured to housing 110 through screws 130 being received through holes 121 of the cover plate and columns 131 of the housing. Screws 130 can be any type of screw known in the art. Holes 121 are shaped and sized to correspond to a head of screws 130. Column 131 extends from bottom surface 118 within housing 110, and is shaped and sized to correspond to a shaft of screws 130. In other examples, there may be any number of screws 130, and corresponding openings 121 and columns 131, to secure cover plate 120 to housing 110.

Figure 3:
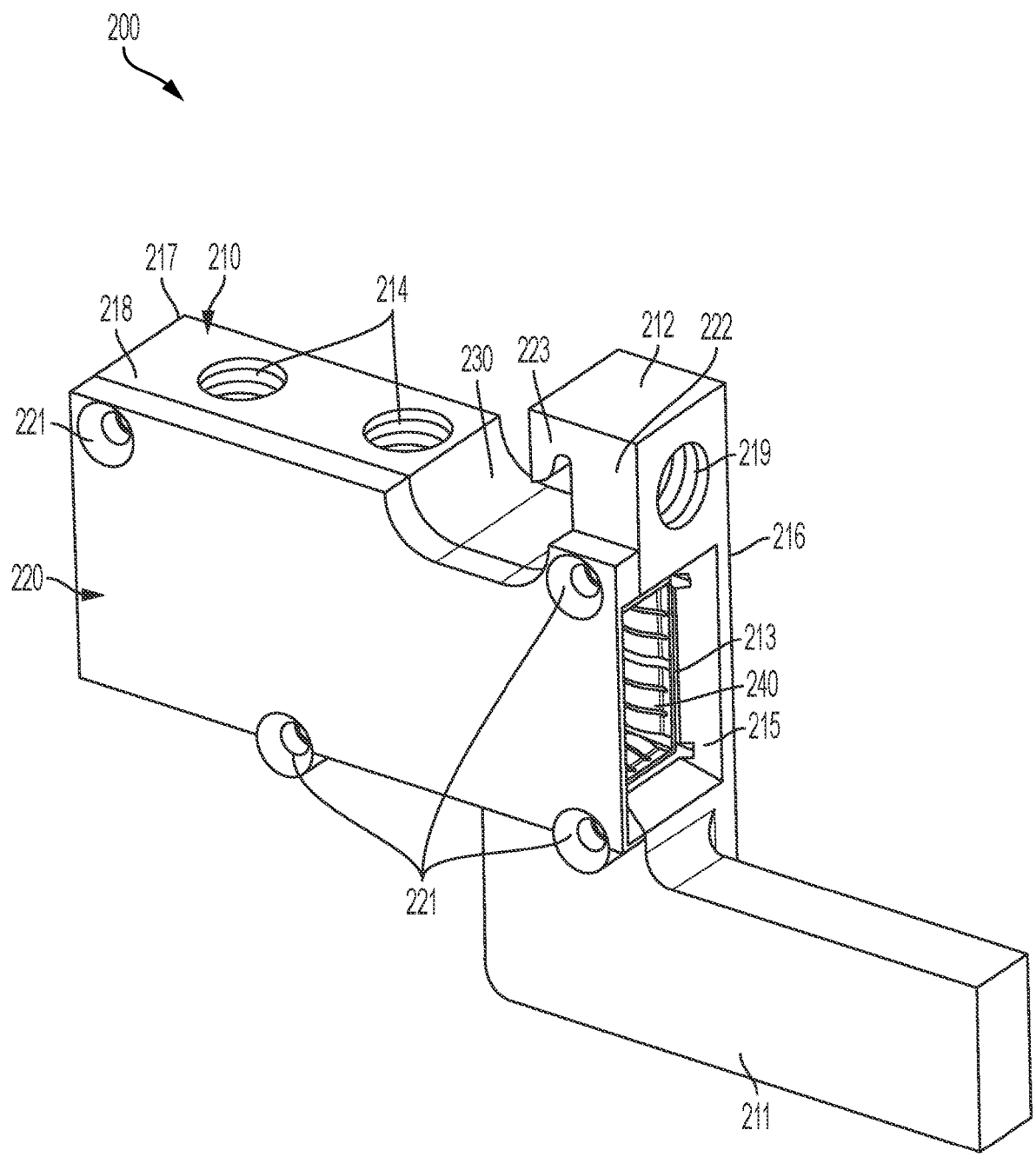
FIG. 3 is an isometric view of an enclosure in accordance with aspects of the disclosure.

FIG. 3 depicts another example enclosure 200 having a housing 210 and cover plate 220. In this example, the robot-engaging mechanism may be an extension to be grasped by a robot. The enclosure 200 may include one or more features similar or identical to those of enclosure 100. For example, housing 210 includes a first top surface 218, and a first end 216 and second end 217 defining a longitudinal axis therebetween. Moreover, housing 210 defines receptacles 214 extending within the housing from first surface 218. Receptacles 214 can be configured to receive a securement mechanism. Hook 212 extends away from a first surface 218 of the housing. Cover plate 220 is also secured to housing 210 through screws (not shown) through holes 221 defined by the cover plate.

In the enclosure 200, the robot-engaging mechanism is a substantially rectangular extension 211 extending from a bottom surface of housing 210 opposite first surface 218 in an L-shaped configuration. Extension 211 extends along a same direction as, and offset from, the longitudinal axis defined by housing 210. In this manner, extension 211 can ensure that a robot can grasp the extension and interface with enclosure 200 at an appropriate orientation prior to inserting or disengaging an end of a connector with connector receptacle 213. As extension 211 can be shaped and sized to be grasped by a robot to ensure consistent engagement between enclosure 200 and the robot, there may be any number of shapes or sizes of the extension. For instance, extension 211 can be triangular, spherical, or any other geometric prism. In a further example, there may be any number of extensions 211, such as two, three, four, or any other number. In a yet further example, extension 211 may be angled transverse to housing 210.

Connector cage 240 is received within a connector receptacle 213 defined within housing 210 and is configured to receive a QSFP end of a connector. Housing 211 defines a chamfered lead-in portion 215 from first end 216 to connector receptacle 213. Chamfered lead-in portion 215 can minimize the precision required to insert a connector within the connector receptacle. In this manner, lead-in portion 215 can allow for a more repeatable connector insertion. Alternatively, housing 211 may have no lead-in portion 215.

A position of enclosure 200 is secured to an adjacent structure, such as a server rack in a data center, through a securement mechanism (not shown) received within receptacles 214. This securement mechanism can be a magnet, suction cup, screw, adhesive surface, or any other means of securing the position of enclosure 200 to the adjacent structure. In this manner, the securement mechanism can minimize the risk of moving or re-orienting enclosure 200. For example, magnets can be inserted within receptacles 214. In this manner, enclosure 200 can be secured to the adjacent structure through an attractive magnetic force between the enclosure and the adjacent structure.

Hook 212 includes a body 222 extending from first surface 218 and a lip 223 extending from the body of the hook. Hook 212 has a width similar to the width of housing 210. Hook 212 can be configured to mate with the adjacent structure to assist in maintaining the position of enclosure 200. Hook 212 includes a receptacle 219 defined along a central portion of body 222 of the hook and opposite the hook's lip 223 substantially along the same direction as the longitudinal axis of housing 210. Receptacle 219 can be configured to receive a securement mechanism (not shown) similar to one configured to be received in receptacles 214. In this manner, receptacle 219 can provide an additional securement mechanism to secure the position of enclosure 200 to the adjacent structure. In other examples, receptacle 219 can be defined along any other portion of body 222, such as adjacent a top or bottom end of the body of hook 212. Moreover, receptacle 219 can be transverse to the longitudinal axis of housing 210. In further examples, there may be any number of receptacles 219 defined along body 222, such as two, three, four, or any other number.

Cavity 230 is defined along first surface 218 of housing 210 and a surface of cover plate 220 beneath hook 212. Cavity 230 can be configured to receive a portion of adjacent structure, such as an overhanging portion of server rack. An end of cavity 230 abuts against body 222, and beneath lip 223, of hook 212. In this manner, cavity 230 can receive a portion of the adjacent structure that is also engaged with, or adjacent to, hook 212. Cavity 230 may alternatively be located along any portion of housing 210 and cover plate 220, such as along a side or bottom surface, and may have any shape corresponding to the portion of the adjacent structure. For example, cavity 230 may be defined along housing 210 and cover plate 220 adjacent second end 217.

Cover plate 220 is secured to housing 210 through holes 221. For example, screws (not shown) can engage holes 221 to secure cover plate 220 to housing 210. Cover plate 220 forms a part of lead-in portion 215 from first end 216 to connector receptacle 213.

Figure 4:
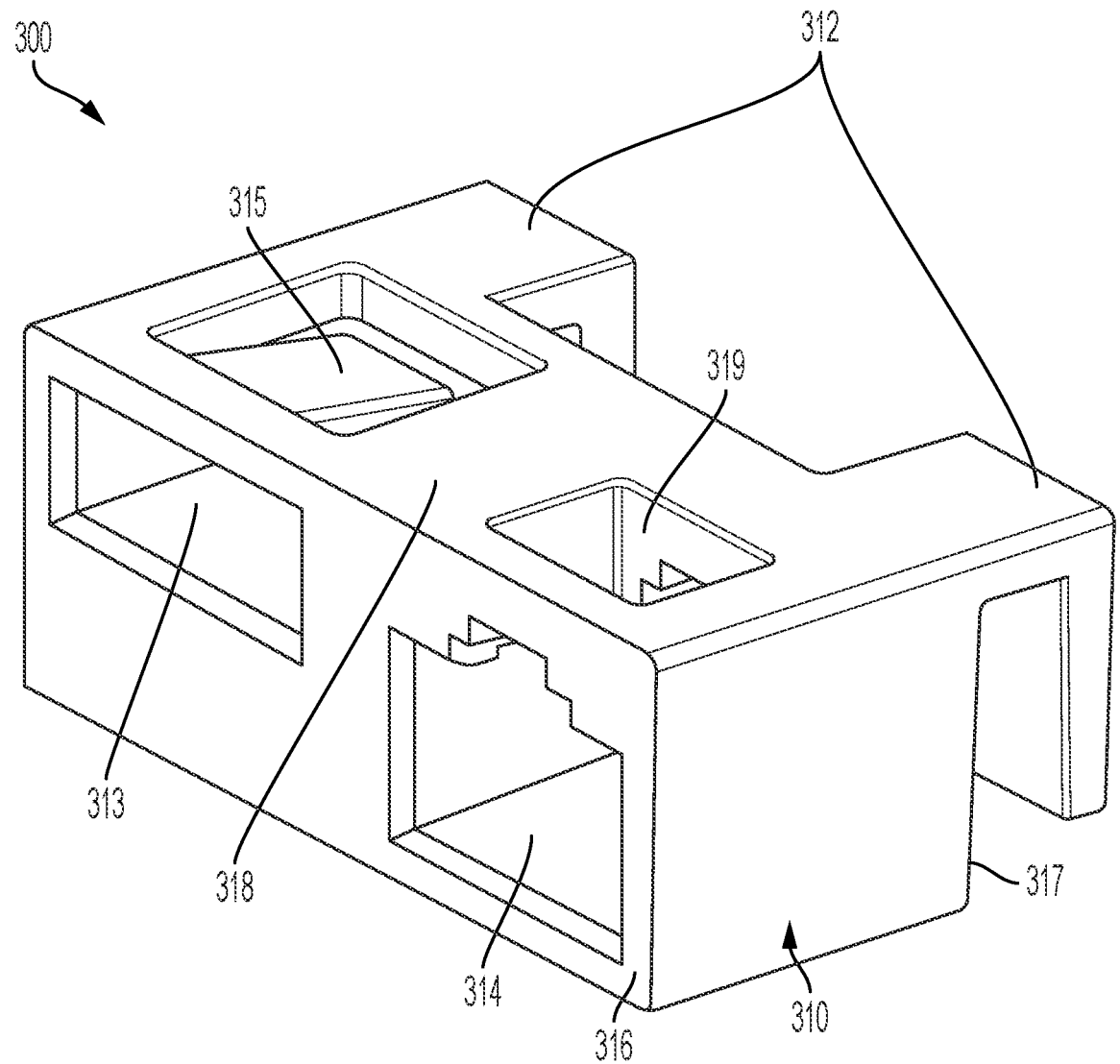
FIG. 4 is an isometric view of an enclosure in accordance with aspects of the disclosure.

FIG. 4 depicts another example enclosure 300 having housing 310. In this example, the enclosure 300 is monolithic with multiple hooks 312. The enclosure 300 may include one or more features similar or identical to those of enclosure 100, 200. For example, housing 310 includes a first end 316 and second end 317 opposite first end 316. Connector receptacles extend within housing 310 from first end 316.

Hooks 312 extend from second end 317 opposite first end 316. Hooks 312 can be configured to secure a position of enclosure 300 to an adjacent structure, such as a server rack of a data center to minimize the risk of moving or re-orienting enclosure 300. Hooks 312 are located at each end of the width of housing 310. In other examples, hooks 312 may extend from any portion of housing 110, such as from a side, bottom, or top surface. Moreover, one hook 312 may extend from one surface, such as a side surface, and another hook may extend from another surface, such as a bottom surface.

Connector receptacles 313, 314 extend from first end 316 within housing 310. Connector receptacle 313 is shaped and sized to receive a USB-A end of a connector (not shown) without a connector cage. Housing 310 defines a clip 315 extending within connector receptacle 313 at an angle from surface 318. Clip 315 can assist in securing the USB-A end of the connector by engaging a portion of the USB-A end. Connector receptacle 314 is shaped and sized to receive a RJ45 end of a connector (not shown) without a connector cage. Housing 310 has a surface 318 defining opening 319. Opening 319 is in communication with connector receptacle 314. The opening 319 may facilitate the engagement between the RJ45 end of the connector with housing 310. In other examples, a connector cage can be inserted within connector receptacles 313, 314 corresponding to the end of the connector. In a yet further example, enclosure 300 can include a robot-engaging mechanism such as a plurality of indents, an extension, holes, pins, or other features that a robot can engage with.

The enclosure may be constructed, in whole or in part, from one or more metals including, titanium and its alloys, stainless steel and its alloys, magnesium and its alloys, cobalt and its alloys, nickel and its alloys, silver, tantalum, or any other kinds of metals. The enclosure may also be made from one or more polymers such as any one or combination of polyethylene (PE), high-density polyethylene (HDPE), polyvinyl chloride (PVC), silicone, cross-linked polymers, or any other polymers.

With reference to FIGS. 5-10, a method of use will now be described. A robot 700 may be tasked to automatically maintain operations within a data center, including replacing parts of a data center, such as servers, batteries or the like. In such an instance, robot 700 will disengage connector 800 from the part to be replaced to engage a connector end 600 to enclosure 400 so that the robot can perform the replacement and later retrieve the connector end from the enclosure. Enclosure 400 is a schematic illustration of any of enclosures 100, 200, 300 and can have features similar to those aspects of those enclosure described above.

In other examples, the method may include robot 700 engaging a robot-engaging mechanism of enclosure 400 and moving the enclosure from a first location within a data center to a second location within the data center. In this manner, enclosure 400 can be more conveniently placed adjacent an area of the data center that robot 700 is tasked with working on. Robot 700 may move enclosure 400 before, during, or after the performance of its assigned task.

Enclosure 400 is engaged with an adjacent structure, such as a server rack 500, through hooks and securement mechanisms. With specific reference to FIGS. 1-2, enclosure 400 can have a similar structure to enclosure 100 and be secured to server rack 500 through hook 112 receiving a portion of the server rack and a securement mechanism, such as magnet 150, enabling an attractive force between the enclosure and the server rack. With specific reference to FIG. 3, enclosure 400 can have a similar structure to enclosure 200 and be secured to server rack 500 through hook 212 and a securement mechanism received in at least one of receptacles 214, 219. Such a securement mechanism can be a magnet, suction cup, adhesive surface, screw, or the like to assist in engaging enclosure 200 to server rack 500. With specific reference to FIG. 4, enclosure 400 can have a similar structure to enclosure 300 and be secured to server rack 500 through hooks 312.

After robot 700 has located enclosure 400 by, for instance, accessing a memory housing the position of the enclosure relative to a map of the data center, the robot approaches enclosure 400 with a connector 800 while holding connector end 600, as shown in FIG. 5.

Robot 700 then engages a robot-engaging mechanism of enclosure 400 to ensure that the robot is in a certain orientation with respect to the enclosure and to precisely insert connector end 600 into the enclosure, as shown in FIG. 6 and with reference to block 910. With specific reference to FIGS. 1-2, robot 700 can insert a portion of itself, such an end-effector or gripper, into indents 111 such that the robot can be precisely aligned with respect to the indents and, therefore, the enclosure 100. With specific reference to FIG. 3, robot 700 can grasp extension 211 in order for the robot to be properly aligned with the extension and, therefore, enclosure 200.

Figure 2:
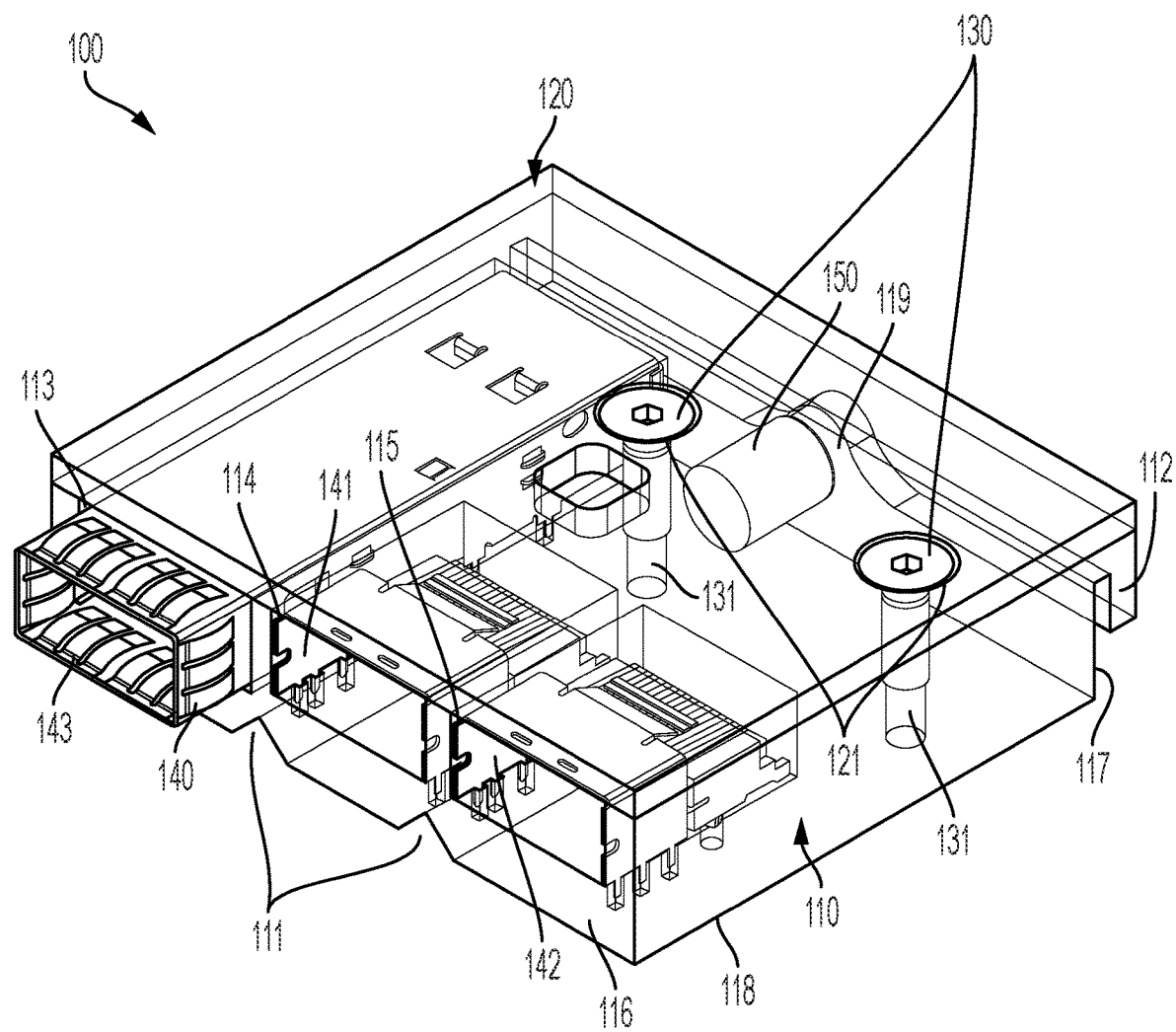
FIG. 2 is an isometric view of the internal components of the enclosure of FIG. 1.

Continuing with FIG. 6 and with reference to block 920, once robot 700 has engaged the robot-engaging mechanism of enclosure 400 and is properly oriented, the robot then inserts connector end 600 within a connector receptacle of the enclosure and disengages from the connector end to be left within the enclosure. This can be connector receptacles 113, 114, 115 as shown in FIGS. 1-2, connector receptacles 213 as shown in FIG. 3, or connector receptacles 313, 314 as shown in FIG. 4. This may include inserting only one connector end 600 or multiple connector ends.

Robot 700 can then disengage with the robot-engaging mechanism by, for instance, extracting the portion of the robot within indents 111 of enclosure 100 or releasing extension 211 of enclosure 200. Once robot 700 has disengaged with the robot-engaging mechanism, the robot can then move onto performing other operations. For example, now that connector 800 has been moved, as shown in FIG. 7, the robot can replace a server or battery in the data center that was previously blocked by the connector 800.

After robot 700 has finished performing the requisite operation and wishes to retrieve connector 800, the robot again approaches enclosure 400 and engages with the robot-engaging mechanism as before, as shown in FIG. 8 and with reference to block 930. Once robot 700 has again re-oriented itself to enclosure 400, the robot engages with connector end 600 and disengages the connector end from the connector receptacle of the enclosure, with reference to block 940. Robot 700 can then take connector 800 by connector end 600 to be re-inserted within the replaced part of the data center, such as a new battery.

In order to improve the automation of certain operations, such as replacing parts of a data center for maintenance, it would be an advantage to be able to automate the management of connectors connected to those parts. However, current designs do not allow for such automation as modern robots are unable to accurately and consistently detach those connectors, find and grasp the ends of those connectors, and re-attach those ends. As such, humans are required to perform these operations.

The enclosures of this disclosure provides an improvement in automatic connector management by allowing for a consistent location that a robot can find and a set of robot-engaging mechanisms that a robot can repeatedly interface with to accurately insert an end of a connector. A specific hurdle that the enclosures of this disclosure overcomes is the precision and consistency required for a robot to insert and detach a connector end, and to do so in a repeatable fashion. The specific structure of the robot-engaging mechanism of the enclosures, including the plurality of indents or the extension, can enable the robot to properly align itself with the enclosure in order to accurately insert and detach the ends of the connector with the enclosure. Moreover, the securement mechanisms and hooks of the enclosures can minimize the risk the enclosure moves or is re-oriented from a given position prior to engagement by the robot. This allows for the robot to more easily and consistently locate the enclosure while still enabling the enclosure to be moved to a more convenient location by the robot.

Although the subject matter herein has been described with reference to particular examples, it is to be understood that these examples are merely illustrative of the principles and applications of the subject matter described. It is therefore to be understood that numerous modifications may be made and that other arrangements may be devised without departing from the spirit and scope as defined by the appended claims.

The invention claimed is:

1. An enclosure comprising:
    a housing having a first end and a second end opposite the first end, the housing having a first connector receptacle at the first end, the housing having a surface defining a robot-engaging mechanism;
    a hook extending from the second end of the housing and comprising a lip, wherein the hook defines a space between the lip and the second end of the housing; and
    a securement mechanism at the second end of the housing configured to act on an object received in the space to inhibit movement of the housing relative to the object.

2. The enclosure of claim 1, further comprising a cover plate opposite the surface of the housing and secured to the housing through a plurality of screws.

3. The enclosure of claim 2, wherein the housing includes a second connector receptacle at the first end, the connector receptacle including a first cage for receiving a first connector and the second connector receptacle including a second cage for receiving a second connector.

4. The enclosure of claim 1, wherein the robot-engaging feature is a plurality of elongated triangular indents along a bottom surface of the housing.

5. The enclosure of claim 1, wherein the housing defines a width, the hook extending the width of the housing.

6. The enclosure of claim 1, wherein the securement mechanism is one of a magnet, suction cup, screw, or adhesive surface.

7. The enclosure of claim 6, wherein the securement mechanism is a magnet within the housing.

8. An enclosure comprising:
   a housing defining a length, the housing having a first end, a first surface, and a second surface opposite the first surface, the housing defining a connector receptacle adjacent the first end;
   a hook extending from the first surface of the housing adjacent the first end, the hook comprising a body, a lip extending from the body curved about a hook axis, and a magnet secured within the hook within an opening transverse to the hook axis;
   a securement mechanism secured along the length of the housing; and
   a robot-engaging mechanism extending from the second surface of the housing and adjacent the first end.

9. The enclosure of claim 8, wherein the housing defines a longitudinal axis and the robot-engaging mechanism is an extension that extends in a direction along, and offset from, the longitudinal axis.

10. The enclosure of claim 8, wherein the housing defines a chamfered portion from the first end to the connector receptacle.

11. The enclosure of claim 8, wherein the housing defines a longitudinal axis and the receptacle is transverse to the longitudinal axis.

12. The enclosure of claim 8, wherein the securement mechanism is one of a magnet, suction cup, screw, or adhesive surface.

13. The enclosure of claim 12, wherein the securement mechanism is a magnet secured within the receptacle of the housing.

14. A method of using a robot to manage connectors, comprising:
   engaging, by the robot, a robot-engaging mechanism of an enclosure, the enclosure comprising a hook extending from the housing and a securement mechanism secured within the housing;
   inserting, by the robot, an end of a connector in a connector receptacle defined by a housing of the enclosure;
   engaging, by the robot, the end of the connector; and
   disengaging, by the robot, the end of the connector from the connector receptacle;
   wherein either or both of inserting the end of the connector and disengaging the end of the connector include automated use of an end effector of the robot to grasp the connector and move the connector relative to the housing.

15. The method of claim 14, wherein the robot-engaging mechanism is a plurality of elongated triangular indents, and engaging the triangular indents includes inserting a portion of the robot into the triangular indents.

16. The method of claim 14, wherein the robot-engaging mechanism is an extension extending from the housing, and engaging the extension includes grasping the extension.

17. The method of claim 14, wherein the securement mechanism is a magnet within a receptacle of the housing.

18. The method of claim 14, further comprising moving, by the robot, the enclosure from a first location to a second location.

19. The method of claim 18, wherein the enclosure is engaged to a first structure in the first location and engaged to a second structure in the second location.

20. The method of claim 14, wherein engaging, by the robot, the robot-engagement mechanism includes determining an orientation of the robot relative to the enclosure by engagement of an end effector of the robot with the of the robot-engagement mechanism.

\* \* \* \* \*